United States Patent [19]

Sakagami et al.

[11] Patent Number: 4,784,915
[45] Date of Patent: Nov. 15, 1988

[54] POLYMER PIEZOELECTRIC FILM

[75] Inventors: Teruo Sakagami; Kenichi Nakamura; Naohiro Murayama, all of Iwaki, Japan

[73] Assignee: Kureha Kagaku Kogyo Kabushiki Kaisha, Tokyo, Japan

[21] Appl. No.: 640,835

[22] Filed: Aug. 15, 1984

[30] Foreign Application Priority Data

Aug. 16, 1983 [JP] Japan ............................. 58-148785
Aug. 24, 1983 [JP] Japan ............................. 58-153125

[51] Int. Cl.⁴ .................... H01L 41/08; H01L 41/18; C08F 214/28
[52] U.S. Cl. .................... 428/421; 428/422; 428/457; 427/100; 526/255; 310/800; 310/313 A; 310/357
[58] Field of Search .............. 428/421, 457, 422; 427/100; 526/250, 255

[56] References Cited

U.S. PATENT DOCUMENTS

| 3,798,473 | 3/1974 | Murayama et al. | 310/8 |
| 3,931,446 | 1/1976 | Murayama et al. | 428/421 |
| 4,024,135 | 5/1980 | Murayama et al. | 310/357 |
| 4,335,238 | 6/1982 | Moore et al. | 428/421 X |
| 4,400,642 | 8/1983 | Kiraly | 428/421 X |
| 4,427,609 | 1/1984 | Broussoux et al. | 428/421 X |
| 4,521,322 | 6/1985 | Broussoux et al. | 428/421 X |
| 4,543,293 | 9/1985 | Nakamura et al. | 428/421 |
| 4,543,294 | 9/1985 | Sakagami et al. | 428/422 |

FOREIGN PATENT DOCUMENTS

| 0037877 | 10/1981 | European Pat. Off. |
| 1515799 | 6/1978 | United Kingdom |
| 1589746 | 5/1981 | United Kingdom |
| 2121810 | 1/1984 | United Kingdom |

Primary Examiner—P. C. Ives
Attorney, Agent, or Firm—Wenderoth, Lind & Ponack

[57] ABSTRACT

A polymer piezoelectric film comprising a poled film of a vinylidene fluoride copolymer having a high molecular weight as defined by an inherent viscosity within a specific range comprising 40 to 90 mol. % of vinylidene fluoride and 10 to 60 mol. % of trifluoroethylene. Such a high molecular weight vinylidene fluoride copolymer can give a preferable state of molecular arrangement during film formation, particularly preferably formation by casting, to provide a film excellent in piezoelectric characteristic and secondary processing characteristic.

7 Claims, 1 Drawing Sheet

POLYMER PIEZOELECTRIC FILM

BACKGROUND OF THE INVENTION

This invention relates to a polymer piezoelectric film having high piezoelectric performance even in a high frequency region and also endowed with excellent element manufacturability and to a process for producing the same, particularly to a polymer piezoelectric film suitable for ultrasonic Etransducer and to a process for producing the same.

As a polymeric piezoelectric material having high piezoelectric performance, U.S. Pat. No. 3931446 for example, discloses polyvinylidene fluoride. Also reported are vinylidene fluoride copolymers in U.S. Pat. No. 4204135, Japanese Pat. (Kohkai) Nos. 56-111281 and 58-60585. Moreover, these vinylidene fluoride resins are reported to have high piezoelectric performance even in a high frequency region, as disclosed in U.S. Pat. No. 3798473. These polymeric piezoelectric materials are generally formed into piezoelectric films by forming them into films according to rolling or casting, then applying heat treatment on the film surface in order to enhance the electro-mechanical coupling factor $k_t$ (hereinafter frequently referred to merely as "$k_t$") in the direction perpendicular thereto and applying an electric field in the direction perpendicular to the film to effect poling treatment. Among a series of these vinylidene fluoride resins, polyvinylidene fluoride has a $k_t$ value of about 0.2 and is also excellent in formability, thus being expected to be the most promising polymeric element material for ultrasonic transducers. However, further improvement of the electro-mechanical coupling factor $k_t$ is desired.

On the other hand, the vinylidene fluoride copolymers disclosed in the above-mentioned Patent Publications, particularly the copolymer of vinylidene fluoride and trifluoroethylene, having a composition of about 75 mol. % of vinylidene fluoride and about 25 mol. % of trifluoroethylene, either in the form of a rolled or a casted film, has a $k_t$ value surpassing that of polyvinylidene fluoride. However, the film product of this copolymer is susceptible to generation of cracks, when processed to have a concave plane for the purpose of enhancing transmitting and receiving sensitivities of an ultrasonic transducer, and therefore production yield of elements is very poor.

Cracks are liable to be generated because crystallinity is extremely increased when a vinylidene fluoride-trifluoroethylene copolymer is heat-treated for enhancing $k_t$, as compared with a polyvinylidene fluoride. In this connection, when heat treatment is suppressed by shortening the time therefor to the extent that the production yield of element is not worsen, the $k_t$ value is merely slightly higher than that of polyvinylidene fluoride, whereby formation of the copolymer is of little significance.

SUMMARY OF THE INVENTION

A primary object of the present invention is, in view of the problems of the prior art as described above, to provide a vinylidene copolymer piezoelectric film which is excellent in secondary processing characteristic or deformation durability as required for enhancement of the production yield of elements for ultrasonic transducer, and has also a relatively higher $k_t$. Another object of the invention is to provide a process for producing such a vinylidene copolymer piezoelectric film.

We have studied intensively with the objects as mentioned above about the characteristics of a vinylidene fluoride copolymer. Consequently, it has now been found that lowering in deformation durability such as crack generation during flexing caused by the heat treatment for improvement of $k_t$ is not necessarily an inherent characteristic of the vinylidene copolymer film, but it has been caused by an inappropriate arrangement of the polymer molecular chains in the film. In particularly, a film obtained by film formation of a vinylidene fluoride-trifluoroethylene copolymer having a molecular weight of a certain value or more, probably because of higher degree of orientation of the molecular chain axis in parallel to the film plane, namely higher planar orientation, is found to have not only a relatively high $k_t$, but also a practically satisfactory secondary processing characteristic after heat treatment and poling treatment.

The polymer piezoelectric film of the invention is based on such a finding and, more specifically, comprises a poled film of a vinylidene fluoride copolymer comprising 40 to 90 mol. % of vinylidene fluoride and 10 to 60 mol. % of trifluoroethylene and having an inherent viscosity of 1.8 dl/g or more as measured in a dimethylformamide solution at a concentration of 0.4 g/dl at 30° C.

As the method for giving a preferable arrangement of molecular chains in the vinylidene fluoride copolymer film as specified above, the casting method is the most suitable, and it is preferable to apply appropriate heat treatment and electric field treatment on the thus obtained cast film to form a piezoelectric film. More specifically, the process for producing the polymer piezoelectric film according to the present invention comprises casting the above vinylidene fluoride copolymer into a film, subjecting the resultant copolymer film to heat treatment at a temperature between the temperature lower by 5° C. than its crystal transition point and its melting point and poling the film simultaneously with or after the heat treatment by application of a direct current field substantially perpendicular to the copolymer film.

In reviewing the prior art techniques for production of vinylidene fluoride-trifluoroethylene copolymer piezoelectric films in the light of the present invention, Japanese Pat. (kohkai) No. 56-111281discloses examples of film formation by thermal processing such as extrusion, rolling, etc. However, these methods are not preferable as a method for arrangement of polymer molecular chains in the direction in parallel with the film plane. On the other hand, casting from a polymer solution can potentially give a good arrangement of polymer molecular chains, but the polymer is required to have a considerably high molecular weight in order to obtain a practically good arrangement. This point has been found by us in casting of a vinylidene fluoride polymer, as disclosed in Japanese Patent Application No. 214249/1982. This is also recognized in the vinylidene fluoride-trifluoroethylene copolymer in the present invention. On the contrary, in the prior art employing film formation according to casting of this copolymer, the significance of the molecular weight as described above has not been recognized at all, and it cannot be considered either that the above copolymer having a sufficiently high molecular weight has been employed. For example, the copolymer employed in the specific example disclosed in U.S. Pat. No. 4204135 has an inherent viscosity of about 1.0 dl/g. On the other hand, in the specific example disclosed in Japanese Pat. (Kohkai) No. 58-60585, a highly concentrated solution is employed and, in view of the solubility of this copolymer, the copolymer adopted is considered to have a relatively small molecular weight.

DETAILED DESCRIPTION OF THE INVENTION

Figure 1:
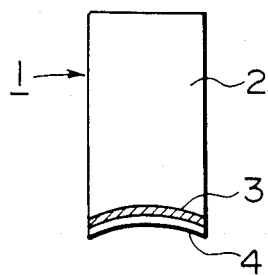
FIG. 1 shows a longitudinal sectional view of an ultrasonic transducer employing the piezoelectric film of the present invention.

The vinylidene fluoride copolymer to be used as the starting material in the present invention comprises, in view of the $k_t$ and flexibility of the piezoelectric film obtained, as essential components, 40 to 90 mol. %, preferably 65 to 85 mol. % of vinylidene fluoride and 10 to 60 mol. %, preferably 15 to 30 mol. % of trifluoroethylene. The starting polymer may preferably be a binary copolymer consisting of the above two components. Otherwise, it is also possible to add a small amount of at least one of fluorinecontaining monomers such as vinyl fluoride, tetrafluoroethylene, hexafluoropropylene, trifluorochloroethylene and the like. In any of the above cases, if the contents of vinylidene fluoride and trifluoroethylene fall outside the above ranges, the resultant piezoelectric film has a smaller $k_t$ or the ability of transmitting and receiving ultrasonic waves may become smaller, or flexibility of the film may be lost. Therefore, it is required to contain the two essential components within the ranges as specified above.

A preferable example of additional fluorine-containing monomer is vinyl fluoride and, in this case, the starting vinylidene fluoride copolymer should preferably have a composition of 60 to 87 mol. %, particularly 65 to 85 mol. %, of vinylidene fluoride, 10 to 40 mol. %, particularly 15 to 30 mol. %, of trifluoroethylene, 3 to 20 mol. %, particularly 5 to 15 mol. %, of vinyl fluoride. Further, as far as the above composition ranges for these component are satisfied, additional fluorine-containing monomers other than vinyl fluoride may also be incorporated.

In the present invention, of the above vinylidene fluoride copolymers as described above, those having an inherent viscosity as measured in a dimethylformamide solution at a concentration of 0.4 g/dl at 30° C. (in the present specification, this definition is applied to the simple expression of "inherent viscosity") of 1.8 dl/g or more, preferably 2.0 dl/g or more, more preferably 3.0 dl/g or more are used. The upper limit of the inherent viscosity is not particularly limited, but difficulty in molding or forming may be encountered as this value is greater. For example, in the case of film formation according to the solvent casting method according to the present process, it becomes necessary to lower the resin concentration in a solution, thus involving the difficulty in preparation of a thick film. Accordingly, it is preferred to use a copolymer having an inherent viscosity not higher than 10.0 dl/g, more preferably not higher than 9 dl/g, particularly not higher than 8 dl/g.

For obtaining a film from the copolymer as described above, it is preferable to employ a method which can easily cause plane orientation such as the casting method employing solvent, the T-die extrusion method, the press molding method, etc. Above all, it is particularly preferred to employ the casting method employing solvent according to the present invention. As the solvent to be used for formation of a solution, there may be employed any solvent which can dissolve the copolymer. For example, a polar organic solvent such as dimethylacetamide, dimethylformamide, dimethylsulfoxide, etc. may preferably be used. The resin concentration, which may also differ depending on the polymerization degree of the copolymer, may practically be 0.3 to 15 wt. %, particularly about 0.5 to 10 wt. %. Film formation according to the solvent casting method may be conducted by forming a wet film by casting or coating of a homogeneous solution at a predetermined concentration as described above on a substrate substantially insoluble with the solvent in the above solution such as a polymeric film, evaporating off the solvent and, if necessary, peeling the film from the substrate. The copolymer may be stretched as desired and may have a thickness generally within the range of from several microns to about 500 microns, preferably from 8 to 100 microns. Then, the copolymer film obtained according to the above method is subjected to heat treatment at a temperature between the temperature lower by 5° C. than the crystal transition point and the melting point. The melting point as herein mentioned refers to the temperature which gives the maximum heat absorption peak in the DSC (differential scanning calorimeter) curve when heated at a temperature elevation speed of 4° C./min. The crystal transition temperature is defined as the temperature which gives the peak or the shoulder appearing on the lower temperature side of the maximum absorption peak, or the peak or the shoulder closer to the melting point when there are a plurality of such peaks or shoulders. This heat treatment is performed for the purpose of improvement of $k_t$ through enhancement of the film crystallinity. The time for the treatment may suitably be determined so that the crystallinity may become substantially saturated, but it is generally about 10 minutes to 2 hours. It is also preferred to use heat treatment under tension (more precisely, heat treament under the condition where the peripheral of the film is fixed to the extent that shrinkage during heat treatment is suppressed).

After the heat treatment, or simultaneously with the heat treatment, an electric field is applied. The electric field may be applied under the conditions which are substantially the same as those employed for the polyvinylidene fluoride piezoelectric film. It is desirable that the intensity of electric field is as high as possible, provided that no dielectric breakdown may occur, and also that the time for application of electric field is as long as possible, whereas an intensity of 300 to 1000 KV/cm and a time of about 10 minutes to 5 hours are frequently adopted in view of production efficiency.

Prior to application of electric field after or simultaneously with the heat treatment, it is also possible to provide electrode films comprising Al, etc., with a thickness of, for example, several tens to several thousands of angstroms on at least one surface of the copolymer film (in the case of one surface is covered, two or more films are used in laminated form), according to, for example, vacuum deposition, sputtering, etc., and, after application of electric field to this film, they can be used as such as the electrodes for driving the piezoelectric film.

The piezoelectric film as prepared above is provided for use after deformation or secondary processing into a shape suitable for the desired element for improvement of the characteristics of the element, as in the case of an ultrasonic transducer element. Of course, it is possible to provide electrode films for driving the piezoelectric film after such deformation or secondary processing.

Examples of suitable secondary processing may include, for example, curving of the film by means of a press for improvement of the transmitting and receiving capabilities of a transducer.

As described above, according to the present invention, by using a vinylidene fluoride-trifluoroethylene copolymer having a sufficiently large molecular weight, forming the copolymer into a film preferably by casting and applying heat treatment and electric field treatment to the film, a vinylidene fluoride piezoelectric film capable of providing generally electro-mechanical transducer elements with high transducing efficiency, particularly an element for ultrasonic transducer, because of its relatively higher $k_t$ and excellent secondary processability, can be obtained.

The present invention is described in more detail by referring to the following Examples and Comparative Examples.

EXAMPLE 1

Into a stainless steel autoclave equipped with a stirrer was charged an aqueous solution containing methyl cellulose as the suspending agent and, after the solution was cooled to 5° C., n-propylperoxydicarbonate as the polymerization initiator and other polymerization aids were added. After replacement with nitrogen, the mixture was thoroughly stirred. Then, the autoclave was cooled externally with methanol-dry ice system, and vinylidene fluoride and trifluoroethylene were injected into the autoclave from bombs so that the molar ratios was 75 % and 25 %, respectively. Subsequently, after elevation of the inner temperature in the autoclave, polymerization was initiated and continued while maintaining the external temperature of the autoclave at 20° C. The pressure at the initial stage of polymerization was 32 kg/cm$^2$, which was observed to be lowered with lapse of time until it became finally about 8 kg/cm$^2$, whereupon the residual pressure was purged to complete the polymerization. As the result, white powder was recovered. The powder was well washed with water and dried to obtain white copolymer powder. The yield was above 90%, indicating that a vinary copolymer corresponding to the composition charged was obtained. The copolymer had an inherent viscosity $\eta_{inh}$ of 5.9 dl/g.

This powder was dissolved in dimethylformamide as the solvent at 70° C. to obtain a solution of about 2 wt. % concentration, which was subjected to casting and dried under the condition of 80° C. to obtain a cast film with a thickness of about 30 microns.

The unstretched film was dried in air at 132° C. for one hour, and electrodes were formed on both surfaces thereof by vapor deposition of aluminum. Then, poling was effected by applying a direct current voltage with an electric field intensity of 650 KV/cm at 85° C. for 30 minutes, followed by cooling to room temperature with the voltage being applied continually. The piezoelectric constant $d_{31}$ of this film was measured by means of Rheolograph by Toyo Seiki K.K. at 10 Hz to obtain the result of $d_{31}+d_{32}=25$pC/N. Since the sample employed here was obtained by subjecting an unstretched polymer film to poling, $d_{31}$ was equal to $d_{32}$.

The piezoelectric constants $d_{31}$ and $d_{32}$ are defined as follows. That is, in the case of a polymer exhibiting piezoelectricity, x, y and z axes are determined generally by taking the x axis in the stretched direction, the y axis in the direction of film extension perpendicular to the X axis and the z axis in the direction vertical to the film surface, and the piezoelectric constant indicating polarization in the z axis direction when a stress is applied in the x axis direction is defined as $d_{31}$, while the piezoelectric constants indicating polarizations in the z axis direction when a stress is applied in the y axis direction and the z axis direction are defined as $d_{32}$ and $d_{33}$, respectively.

The electro-mechanical coupling factor $k_t$ (z—z axis direction) of the above obtained film was determined by analysis of frequency dependency of the electric admittance and the phase angle near the free resonance point of the piezoelectric film and was found to be 0.275. As the result of 180° bending test of the piezoelectric film, no breaking occurred after reciprocal bending repeated for 50 times or more, and elongation was measured by means of Tensilon at 25° C., under a humidity of 50%, with a sample length of 4 cm and width of 1 cm, at a drawing speed of 1 cm/min. and found to be 165%.

Figure 2:
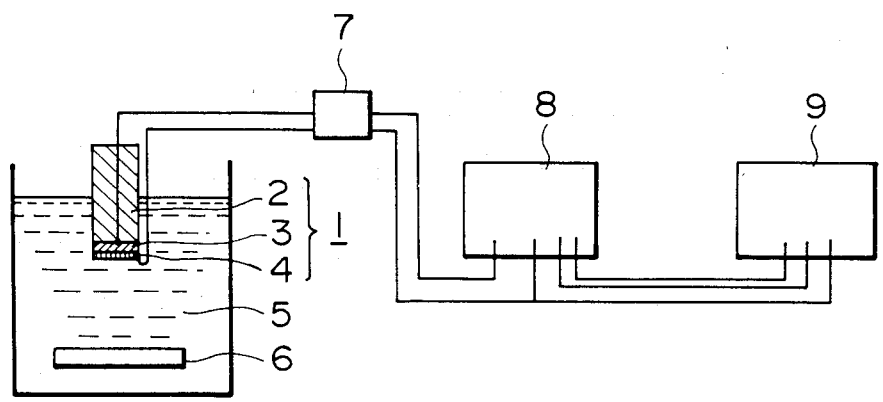
FIG. 2 shows a block diagram of a system for examining the efficiency of transmitting and receiving ultrasonic wave of the ultrasonic transducer.

For examination of the performance of this piezoelectric film in transmitting and receiving ultrasonic waves, an ultrasonic transducer having a longitudinal sectional view as shown in FIG. 1 was prepared. More specifically, the transducer 1 comprised a copper plate 3 with a thickness of ¼ of wavelength (i.e. 60 microns) functioning as an acoustic reflection plate and a piezoelectric film 4, as produced above, successively pressure-bonded through an epoxy adhesive on a concavity with a radius of curvature of 7 mm formed at one end of a Bakelite rod 2. The ultrasonic transducer had on its both surfaces electrodes with a diameter of 10 mm (not shown). Next, as shown in FIG. 2, the ultrasonic transducer 1 was arranged so as to confront an acrylic resin plate 6 immersed in water 5 in a vessel, and also connected to a pulser receiver 8 (K13-UTA-3, produced by AE ROTECH Co.) and an oscilloscope 9 through a matching circuit 7 for measurement of the performance of transmitting and receiving ultrasonic waves according to the pulse echo method. The gain of the receiver was set at 40 dB, and the voltage of the pulse echo was read to obtain a Vpp (peak to peak voltage) of 43 V.

Comparative Example 1

For a cast film with a thickness of about 30 microns obtained from a solution of a binary copolymer (inherent viscosity $\eta_{inh}=1.29$ dl/g) comprising 75 mol. % of vinylidene fluoride and 25 mol. % of trifluoroethylene obtained similarly as in Example 1, heat treatment and polarization treatment were applied under entirely the same conditions as in Example 1. The $d_{31}+d_{32}$ constant of the film obtained was 20 pC/N, with $k_t$ being 0.217. This piezoelectric film was found to be a very fragile film, as it was broken by one reciprocal bending as the result of the 180° bending test and the elongation by means of Tensilon at room temperature was zero. By use of this piezoelectric film, an ultrasonic transducer was prepared similarly as in Example 1 and the output voltage (Vpp) was measured to be 28 V. In preparation of the ultrasonic transducer, due to fragility of the piezoelectric film, cracks were frequently generated in the course of preparation to give great losses.

EXAMPLE 2

According to the same procedure as in Example 1 except for using a gas mixture having a composition of 70 mol. % of vinylidene fluoride, 20 mol. % of trifluoroethylene and 10 mol. % of vinyl fluoride, a ternary copolymer having an inherent viscosity $\eta_{inh}=5.5$ dl/g with a composition substantially equal to the charged composition was obtained at a yield of about 90%.

The copolymer powder was subjected to casting similarly as in Example 1 to obtain a cast film with a thickness of about 30 microns. The film was dried in air, at 145° C. for one hour. Then, aluminum electrodes were formed and polarization treatment were applied on the film under the same conditions as in Example 1. The resultant piezoelectric film was found to exhibit the characteristics of piezoelectric constant $d_{31}+d_{32}=23.3$ pC/N, $k_t=0.258$, number of reciprocal bendings of 50 times or more in the 180° bending test, and an elongation of 180% or more.

EXAMPLES 3 and 4

Example 2 was repeated except that the electric field intensity during poling was changed to 800 KV/cm and 950 KV/cm, respectively, thereby to obtain piezoelectric films.

COMPARATIVE EXAMPLE 2

Example 2 was repeated except for employing a ternary copolymer having the same composition and an inherent viscosity $\eta_{inh}=0.92$ dl/g.

The results obtained for the above Examples and Comparatve Examples are summarized in the following Table 1.

TABLE 1

| | $\eta_{inh}$ (dl/g) | Electric field intensity (KV/cm) | $d_{31}+d_{32}$ (pC/N) | $k_t$ | Bending* strength (times) |
|---|---|---|---|---|---|
| Example | | | | | |
| 1 | 5.9 | 650 | 25 | 0.275 | >50 |
| 2 | 5.5 | 650 | 23.3 | 0.258 | >50 |
| 3 | 5.5 | 800 | 22.7 | 0.282 | >50 |
| 4 | 5.5 | 950 | 22.0 | 0.300 | >50 |
| Comparative Example | | | | | |
| 1 | 1.29 | 650 | 20 | 0.217 | <1 |
| 2 | 0.92 | 950 | 21.5 | 0.245 | <10 |

*Number of bendings until breaking

As can be seen also from the above examples, the piezoelectric film obtained by the present invention ordinarily has an elongation of 20% or higher as a value measured according to the method as shown in the above Example, can have an elongation of 30% or higher, or even 40% or higher according to preferable conditions and is excellent in secondary processing characteristic or durability against deformation for enhancing the transducing performance as an electromechanical transducer element. As is evident from the values of $k_t$ obtained in Examples, namely $k_t=0.258$ or above, $k_t$ is generally 0.22 or more, 0.23 or more under preferable conditions, or even 0.24 or higher. Also, the piezoelectric film has various performances inherent to polyvinylidene fluoride piezoelectric films, including piezoelectricity on elongation and pyroelectricity, and is also characterized by excellent mechanical characteristics.

What is claimed is:

1. A polymer piezoelectric film, comprising a cast and poled film of a vinylidene fluoride copolymer said copolymer being in a form and having a molecular weight to provide a solution suitable for forming into a film by the casting method and comprising 40 to 90 mol. % of vinylidene fluoride and 10 to 60 mol. % of trifluoroethylene and having an inherent viscosity of 3.0 dl/g or more as measured in a dimethylformamide solution at a concentration of 0.4 g/dl at 30° C. and said film having an electromechanical coupling factor $k_t$ of 0.22 or greater.

2. A polymer piezoelectric film according to claim 1, wherein the vinylidene fluoride copolymer comprises 65 to 85 mol. % of vinylidene fluoride and 15 to 30 mol. % of trifluoroethylene.

3. A polymer piezoelectric film according to claim 1, wherein the vinylidene fluoride copolymer contains 3 to 20 mol % of a fluorine containing monomer selected from the group consisting of vinyl fluoride, tetrafluoroethylene, hexafluoropropylene and trifluorochloroethylene.

4. A polymer piezoelectric film according to claim 3, wherein the vinylidene fluoride copolymer comprises 60 to 87 mol. % of vinylidene fluoride, 10 to 40 mol. % of trifluoroethylene and 3 to 20 mol. % of vinyl fluoride.

5. 1 A polymer piezoelectric film according to claim 1, wherein the vinylidene fluoride copolymer has an inherent viscosity of not higher than 10 dl/g.

6. A polymer piezoelectric film according to claim 1, wherein a conductive metal film is formed on at least one surface of the vinylidene fluoride copolymer film.

7. An ultrasonic transducer comprising a polymer piezoelectric film according to claim 6 as the electromechanical coupling element.

* * * * *